United States Patent
Youssef

[11] Patent Number: 6,118,188
[45] Date of Patent: Sep. 12, 2000

[54] APPARATUS AND METHOD FOR SWITCHING BETWEEN TWO POWER SUPPLIES OF AN INTEGRATED CIRCUIT

[75] Inventor: Tom Youssef, Dallas, Tex.

[73] Assignee: STMicroelectronics, Inc., Carrollton, Tex.

[21] Appl. No.: 09/217,321

[22] Filed: Dec. 21, 1998

[51] Int. Cl.$^7$ ...................................................... H03H 5/153
[52] U.S. Cl. .................................. 307/43; 327/63; 327/78
[58] Field of Search ................................. 307/43, 44, 15; 327/78, 37, 87, 97, 63; 340/146.2

[56] References Cited

U.S. PATENT DOCUMENTS

| | | | |
|---|---|---|---|
| 5,426,386 | 6/1995 | Matthews et al. | 327/63 |
| 5,517,153 | 5/1996 | Yin et al. | 327/546 |
| 5,747,890 | 5/1998 | Yin | 307/87 |

*Primary Examiner*—Fritz Fleming
*Assistant Examiner*—Robert L. DeBeradinis
*Attorney, Agent, or Firm*—Theodore E. Galanthay; Lisa K. Jorgenson; Renee M. Larson

[57] ABSTRACT

A power supply switching circuit employs hysteresis to ensure stable, timely, and accurate transition between a primary power source and a secondary power source of an integrated circuit. A comparison element of the circuit compares a first voltage signal derived from a primary voltage of the primary power source to a second voltage signal provided by the secondary power source in order to generate a compare output signal. A voltage divider element of the circuit, characterized as having a RC constant, is coupled to the primary power source and receives the compare signal generated by the comparison element and generates the first voltage signal. A bypass element of the circuit is coupled to the voltage divider element and is controlled by the compare signal to bypass the RC constant of the voltage divider element by immediately pulling the first voltage signal to the primary voltage when, after powering up the primary power source, the first voltage signal becomes greater than the second voltage signal.

19 Claims, 1 Drawing Sheet

6,118,188

APPARATUS AND METHOD FOR SWITCHING BETWEEN TWO POWER SUPPLIES OF AN INTEGRATED CIRCUIT

BACKGROUND OF THE INVENTION

1. Field of the Invention

This invention relates generally to integrated circuits, and in particular to an improved apparatus and method for switching between power supplies.

2. Background of the Invention

There are many environments today in which it is desirable to retain data in integrated circuits in the event that the primary, and typically external, power supply provided to an integrated circuit is interrupted or lost. In memory devices, for example, commercially available circuitry retains data in static random access memories (SRAMs) when primary power is removed. Representative examples of these devices, often referred to as "zero power circuits or devices," are described in the following patents: U.S. Pat. No. 4,122,359, entitled Memory Protection Arrangement; U.S. Pat. No. 4,451,742, entitled Power Supply Control for Integrated Circuit; U.S. Pat. No. 4,713,555, entitled Battery Charging Protection Circuit; and U.S. Pat. No. 5,099,453, entitled Configuration Memory for Programmable Logic Device. In a zero power circuit, the contents of the circuit are typically protected in the event that the primary power supply voltage to the circuit drops below a predetermined or selected voltage level that is normally defined to be a secondary or back-up voltage, such as a voltage supplied from a battery power supply.

In order to switch from the primary power supply to the secondary power supply upon failure of the primary power supply, it is necessary that the voltage level of both the primary and secondary power supplies be monitored and compared relative to each other. Comparators are particularly suited to this purpose. Comparator circuitry will sense when the primary power supply voltage provided to the circuit drops below the secondary power supply voltage by comparing these two voltages and the zero power circuit will accordingly cause the integrated circuit to receive power from the secondary power supply rather than from the primary power supply.

The comparator circuitry also senses when the primary power source becomes larger than the secondary, battery power source so that the zero power circuit will want to switch from the secondary power supply back to the primary power supply voltage. Such is the case when the primary power supply is turned on and is ramping up to its nominal voltage level. The secondary, battery back-up power supply will need to supply the integrated circuit until the primary power supply has exceeded the secondary power supply. A problem occurs, however, in the comparison performed by the comparator circuitry when a primary voltage input signal to the comparator circuitry corresponding to the primary power supply is a derived signal that does not immediately reflect the actual and current value of the primary power supply voltage. This primary voltage input signal, for instance, may be generated by passing the primary power supply voltage through an resistor-capacitive (RC) delay and thus may float until it is pulled to the primary power supply voltage level after a time determined by the amount of the RC delay.

During the time that the primary voltage input signal to the comparator is floating, defined by the RC delay, there is not immediately a differential between the primary and secondary voltage comparator inputs. The comparator circuitry output signal may be correspondingly indeterminate and thus "bounce" before it can settle to the proper level indicative of the difference between the primary and secondary voltage input signals. A temporary, improper comparator circuitry output signal can cause the integrated circuit to be powered by the secondary, battery power supply even when it is less than the primary power supply. Switching back to the battery while the primary power supply is higher than the battery level will cause an unnecessary high dynamic current to be drawn from the battery that will have the unfortunate consequence of reducing the battery life, particularly in those applications in which the external, principal power supply is switched on and off quite often.

From the foregoing description, it can be seen that there is a need in the art to ensure that the output signal of the comparator circuitry be immediately reflective of a true comparison between the primary and secondary power supplies, regardless of any RC delay associated with an input signal to the comparator circuitry, in order to prevent false switching between the primary and secondary power supplies. Addressing this problem of the prior art will provide a more stable switchover between primary and second power supplies as well as prolong the life of the internal secondary, battery back-up power supply of the integrated circuit.

SUMMARY OF THE INVENTION

According to the principles of the present invention, an apparatus and method for switching between two power sources of an integrated circuit, a primary power supply and a secondary power supply, is provided. Both a power supply switching circuit of the integrated circuit and a system containing the same have at least a comparison element, a voltage divider element, and a bypass element. The comparison element compares first and second voltage signals in order to generate a compare output signal; the first voltage signal is derived from a primary voltage provided to the integrated circuit by a primary power source and the second voltage signal is a secondary voltage provided by a secondary power source internal to the integrated circuit. The voltage divider element, characterized as having a RC constant, is coupled to the primary power source and receives the compare signal generated by the comparison element and generates the first voltage signal. The bypass element is coupled to the voltage divider element and is controlled by the compare signal to bypass the RC constant of the voltage divider element by immediately pulling the first voltage signal to the primary voltage when, after powering up the primary power source, the first voltage signal becomes greater than the second voltage signal.

The circuit additionally includes first and second pass elements controlled by the compare signal and coupled to the primary voltage and the secondary voltage, respectively. The logic state of the compare signal causes the first and second pass elements to be on or off in order to pass either the primary voltage or the secondary voltage through an output node of the circuit so as to power the integrated circuit. The selected voltage may be provided to the substrate of the integrated circuit to power it. The system additionally claims the primary and secondary power supplies.

The above as well as additional objectives, features, and advantages of the present invention will become apparent in the following detailed written description.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
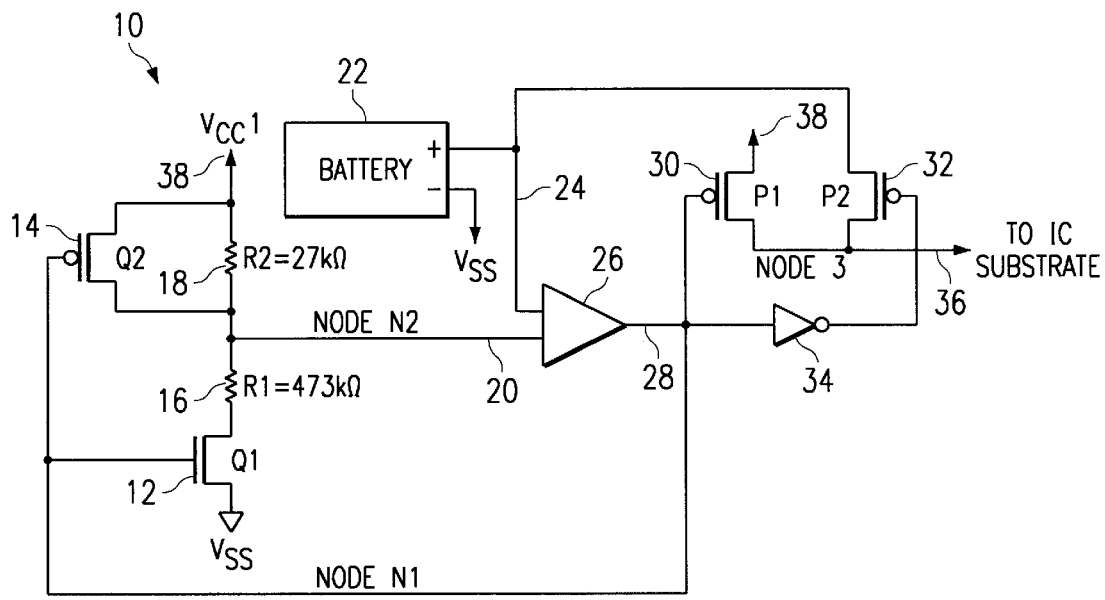
FIG. 1 is a system having hysteresis that is capable of switching between power sources to ensure that power is provided to an integrated circuit, according to the present invention.

Referring now to FIG. 1, a system 10 having hysteresis that is capable of preventing false switching between a primary power supply and a secondary power supply to power an integrated circuit device is shown. It can be seen that system 10 includes has several elements and circuitry, including n-channel transistor 12, p-channel transistors 14, 30, 32, resistors 16, 18, battery 22, comparator 26, and inverter 34. For purposes of the depicted example only, R1 resistor 16 is shown as having a value of 473 KΩ and R2 resistor 18 has a value of 27 KΩ. Vcc1 38 is the primary power supply voltage provided by a primary power source while the voltage 24 provided by battery 22 is the secondary power supply voltage. A first common node between Q2 transistor 14 and R2 resistor 18 is connected to primary power supply voltage Vcc1 38, as is a source/drain of P1 transistor 30. The negative terminal of battery 22 and a source/drain of Q1 transistor 12 are connected to Vss, or "ground," voltage potential. A second common node between Q2 transistor 14 and R2 resistor 18 is coupled to a first terminal of R1 resistor 16 to form a voltage divider that produces signal 20 at node N2 that is a first input signal, derivative of Vcc1 primary power supply voltage 38, to comparator 26. A second terminal of R1 resistor 16 is coupled to a source/drain of Q1 transistor 12 as shown. The output signal 28 of comparator 26 at node N1 is provided to the gates of Q1, Q2 transistors 12, 14 and controls transistors 12, 14. The output signal 28 is additionally provided to the gate of P1 transistor 30 and, through inverter 34, to the gate of P2 transistor 32. A source of P2 transistor 32 is coupled to the positive voltage terminal of battery 22 to form signal 24, a second input signal to comparator 26. P1 and P2 transistors 30, 32 are coupled together at node N3 which is ultimately coupled to the integrated circuit device substrate.

Comparator 26 operates to compare the Vcc1 external power supply voltage 38 to the secondary supply voltage 24 provided by battery 22 and generates output signal 28. When signal 28 is a first logic state, "low" for this configuration of system 10, the integrated circuit device is powered by Vcc1 external, primary power supply voltage 38 and when signal 28 is a second, or "high," logic state, the integrated circuit device is powered by on-chip secondary supply voltage 24 provided by battery 22. How the integrated circuit device is powered is controlled by signal 36 that is provided to power the substrate and the logic of the integrated circuit device.

When the device is powered up by secondary power source battery 22, output signal 28 of comparator 26 is high, node N1 is high and Q1 transistor 12 is turned on. P1 transistor 30 is off, P2 transistor 32 is on, and secondary, battery voltage 24 is used to power the integrated circuit. As the Vcc1 external, primary power supply is being ramped up from zero level, signal 20 at node N2 generated by the R1/R2 voltage divider is equal to Vcc1−200 mV for a nominal condition. When the voltage of signal 20 at node N2 becomes higher in value than the battery voltage level 24, the output signal 28 of comparator 26 at node N1 transitions to a high level, signal 28 at node N1 transitions low and Q1 transistor 12 is turned off. P1 transistor 30 is on, P2 transistor 32 is off, and Vcc1 primary power supply voltage 38 powers the integrated circuit device.

Q2 transistor 14, situated across R2 resistor 18, performs an important function. As Vcc1 principal power supply 38 is ramping up and signal 20 at node N2 becomes higher than the battery voltage 24, Q2 transistor 14 pulls signal 20 at node N2 immediately up to the Vcc1 external, primary power supply voltage level 38, an increase of 200 mV. Q2 transistor 14, then, serves to bypass the delay introduced by the RC time constant, caused by resistors 16, 18 and Q1 transistor 12, so that signal 20 does not float and does not, thereby, cause the system 10 to falsely cause battery 22 to supply power to the integrated circuit device. Since signal 20 at node N2 and battery voltage signal 24 are the two input signals to comparator 26, the greater the differential between voltages 20 and 24 the stability and gain of comparator 26.

Figure 2:
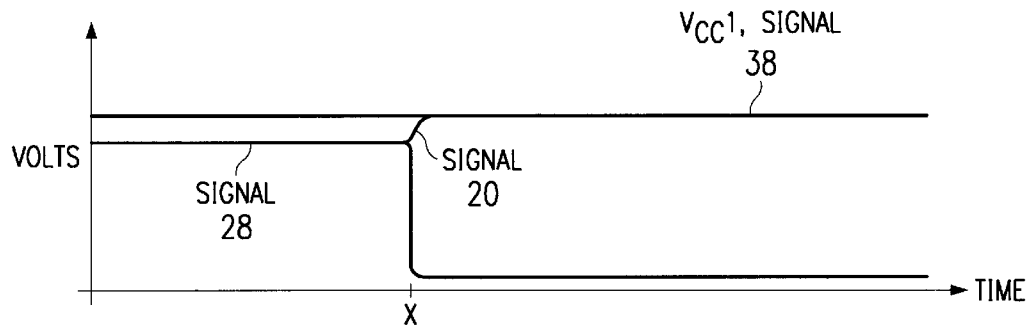
FIG. 2 is a waveform that demonstrates the power source switching capability of the present invention.

Referring now to FIG. 2, a waveform illustrating the improved power supply switching of the present invention is illustrated. It both FIGS. 2 and 3, Vcc1 voltage level 38 is shown as being constant. As previously discussed, Vcc1 ramps up so the portion of the Vcc1 38 shown in FIGS. 2 and 3 occurs after Vcc1 38 has ramped up. It can be seen that as signal 28 at node N1 transitions from a high to a low logic state at time X, there is a virtually instantaneous drop in the voltage from a voltage approximating Vcc1 to a voltage of zero potential. There is none of the attendant bounce in signal 28 during an RC delay, a condition shown in FIG. 3, since Q2 transistor 14 has circumventing the RC delay.

Figure 3:
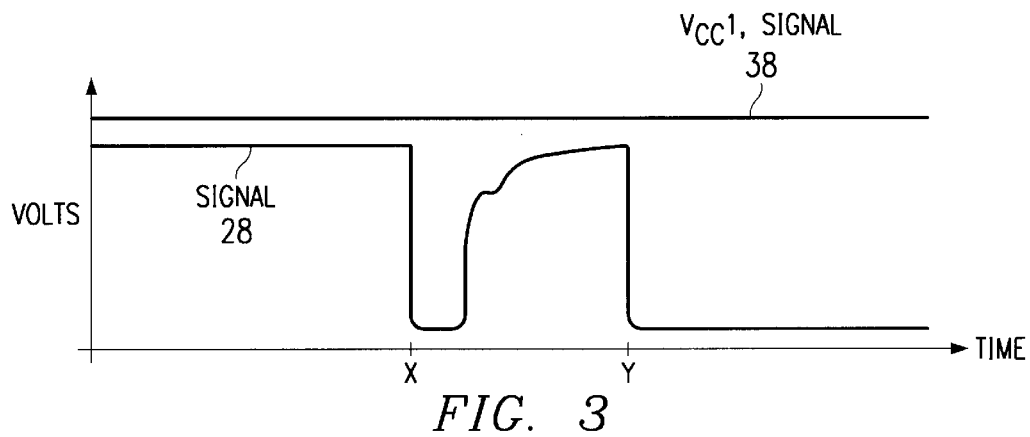
FIG. 3 is a waveform that demonstrates the shortcomings of a power switching system lacking a feature of the present invention.

FIG. 3 illustrates a waveform representative of the bounce in signal 28 at node N1 if Q2 transistor were absent from system 10. Assuming that Q2 transistor 14 were not in FIG. 1, as signal 20 at node N2 became higher than battery voltage 24 signal 28 at node N1 transitions low, Q1 transistor 12 turns off and signal 20 floats until it is pulled to Vcc1 voltage level 38 at the rate of the RC time constant. The RC time constant, and thereby delay, is defined by the resistance of R1, R2 resistors 16, 18, the drain capacitance of Q1 transistor 12, the parasitic capacitance of R1, R2 resistors, and the parasitic capacitance associated with signal 20 bus; in the example of FIG. 1, the RC time delay is approximately 100 nS. During the approximately 100 nS during which signal 20 is floating, from time X when signal 28 should drop to a low logic state until time Y when it actually does settle to the low logic state, it has the opportunity to bounce as shown in FIG. 3. As previously discussed, when signal 28 bounces to the high logic state the battery will erroneously be caused to supply power to the integrated circuit device resulting in an unnecessary high dynamic current being drawn from battery 22. This unnecessary current will reduce the battery life, especially in applications in which the Vcc1 external, primary power supply is being switched off and on with some frequency.

The difference between the waveforms of FIGS. 2 and 3 illustrates the advantage provided by the placement of Q2 transistor 14 in FIG. 1 to circumvent the RC delay associated with signal 20 of Node N2 settling to a steady state following the transition of signal 28 from a high to a low logic state. Preventing signal 20 from floating or bouncing during an RC delay protects the integrated circuit device from being supplied with battery power when unnecessary and also promotes a more stable crossover between primary and secondary power supply voltages as needed.

The present invention can be used in a variety of applications in which it may become necessary to switch between a primary, external power source provided to an integrated circuit device and a secondary, internal back-up power source, such as a battery, to power the integrated circuit device. Integrated circuit devices that would find the invention particularly useful include, but are not limited to, a memory device that must keep very accurate time even when primary power is lost, such as the line of Timekeeper® SRAM devices manufactured by STMicroelectronics, Inc.

While the invention has been particularly shown and described with reference to a preferred embodiment, it will be understood by those skilled in the art that various changes in form and detail may be made therein without departing from the spirit and scope of the invention.

What is claimed is:

1. A power supply switching circuit for switching power supplies of an integrated circuit, the power supply switching circuit comprising:

a comparison element that receives and compares a first voltage signal and a second voltage signal and generates a compare signal, wherein the first voltage signal is derived from a primary voltage provided by a primary power source and the second voltage signal is a secondary voltage provided by a secondary power source;

a voltage divider element, having a RC constant, that is coupled to the primary power source and receives the compare signal generated by the comparison element and generates the first voltage signal that is provided to the comparison element; and a bypass element coupled to the voltage divider element and controlled by the compare signal to bypass the RC constant of the voltage divider element and immediately pull the first voltage signal to the primary voltage when, after powering up the primary power source, the first voltage signal becomes greater than the second voltage signal.

2. The circuit of claim 1, further comprising:

a first pass element controlled by the compare signal generated by the comparison element and coupled to the primary voltage; and a second pass element controlled by the compare signal and coupled to the second voltage signal; and an output node of the system, formed by the first pass element coupled to the second pass element, that is coupled to a substrate of the integrated circuit, wherein when the compare signal is a first logic state the first pass element is controlled by the compare signal to be on, the second pass element is controlled by the compare signal to be off, and the output node of the system provides the primary voltage to the substrate of the integrated circuit to power the integrated circuit and when the compare signal is a second logic state the second pass element is controlled by the compare signal to be on, the first pass element is controlled by the compare signal to be off, and the output node of the system provides the secondary voltage to the substrate of the integrated circuit to power the integrated circuit.

3. The circuit of claim 1, wherein the primary power source is a power source external to the integrated circuit and the secondary power source is an internal battery of the integrated circuit.

4. The circuit of claim 1, wherein the voltage divider element comprises:

a transistor having a first terminal, a second terminal coupled to reference voltage, and a control terminal controlled by the compare signal;

a first resistive element having a first terminal and a second terminal, with the second terminal coupled to the first terminal of the transistor; and a second resistive element having a first terminal coupled to the primary voltage and a second terminal coupled to the first terminal of the first resistive element.

5. The circuit of claim 4, wherein the RC constant of the voltage divider element comprises a resistance of the first resistive element, a resistance of the second resistive element, a capacitance of the transistor, and a parasitic capacitance of the first and second resistive elements.

6. The circuit of claim 1, wherein the bypass element is a transistor having a control terminal that is controlled by the compare signal, a first terminal coupled to the primary voltage and a second terminal coupled to the first voltage signal.

7. A power supply switching circuit for switching power supplies of an integrated circuit, the power supply switching circuit comprising:

a comparison element that receives and compares a first voltage signal and a second voltage signal and generates a compare signal, wherein the first voltage signal is derived from a primary voltage provided by a primary power source and the second voltage signal is a secondary voltage provided by a secondary power source;

a voltage divider element, having a RC constant, that is coupled to the primary power source and receives the compare signal generated by the comparison element and generates the first voltage signal that is provided to the comparison element; and means for immediately bypassing the RC constant of the voltage divider element and immediately pulling the first voltage signal to the primary voltage when, after powering up the primary power source, the first voltage signal becomes greater than the second voltage signal.

8. The circuit of claim 7, wherein the means for bypassing the RC constant is a bypass element coupled to the voltage divider element and controlled by the compare signal.

9. A power supply switching system of an integrated circuit for switching between power sources of the integrated circuit, the system comprising:

a primary power source that generates a primary voltage;

a secondary power source that generates a secondary voltage;

a comparison element that receives and compares a first voltage signal and a second voltage signal and generates a compare signal, wherein the first voltage signal is derived from the primary voltage provided by the primary power source and the second voltage signal is the secondary voltage provided by the secondary power source;

a voltage divider element, having a RC constant, that is coupled to the primary power source and receives the compare signal generated by the comparison element and generates the first voltage signal that is provided to the comparison element;

a bypass element coupled to the voltage divider element and controlled by the compare signal to bypass the RC constant of the voltage divider element and immediately pull the first voltage signal to the primary voltage when, after powering up the primary power source, the first voltage signal becomes greater than the second voltage signal;

a first pass element controlled by the compare signal generated by the comparison element and coupled to the primary voltage;

a second pass element controlled by the compare signal and coupled to the second voltage signal; and an output node of the system, formed by the first pass element coupled to the second pass element, that is coupled to a substrate of the integrated circuit, wherein when the compare signal is a first logic state the first pass element is controlled by the compare signal to be on, the second pass element is controlled by the compare signal to be off, and the output node of the system provides the primary voltage to the substrate of the integrated circuit to power the integrated circuit and when the compare signal is a second logic state the second pass element is controlled by the compare signal to be on, the first pass element is controlled by the compare signal to be off, and the output node of the system provides the secondary voltage to the substrate of the integrated circuit to power the integrated circuit.

10. The system of claim 9, wherein the primary power source is a power source external to the integrate circuit and the secondary power source is an internal battery of the integrated circuit.

11. The system of claim 9, wherein the voltage divider element comprises:

a transistor having a first terminal, a second terminal coupled to reference voltage, and a control terminal controlled by the compare signal;

a first resistive element having a first terminal and a second terminal, with the second terminal coupled to the first terminal of the transistor; and a second resistive element having a first terminal coupled to the primary voltage and a second terminal coupled to the first terminal of the first resistive element.

12. The system of claim 11, wherein the RC constant of the voltage divider element comprises a resistance of the first resistive element, a resistance of the second resistive element, a capacitance of the transistor, and a parasitic capacitance of the first and second resistive elements.

13. The system of claim 9, wherein the bypass element is a transistor having a control terminal that is controlled by the compare signal, a first terminal coupled to the primary voltage and a second terminal coupled to the first voltage signal.

14. A power supply switching system of an integrated circuit for switching between power sources of the integrated circuit, the system comprising:

a primary power source that generates a primary voltage;

a secondary power source that generates a secondary voltage;

a comparison element that receives and compares a first voltage signal and a second voltage signal and generates a compare signal, wherein the first voltage signal is derived from the primary voltage provided by the primary power source and the second voltage signal is the secondary voltage provided by the secondary power source;

a voltage divider element, having a RC constant, that is coupled to the primary power source and receives the compare signal generated by the comparison element and generates the first voltage signal that is provided to the comparison element;

means for immediately bypassing the RC constant of the voltage divider element and immediately pulling the first voltage signal to the primary voltage when, after powering up the primary power source, the first voltage signal becomes greater than the second voltage signal; and means for passing the primary voltage or the secondary voltage through an output node of the system that is coupled to the substrate of the integrated circuit to power the integrated circuit, wherein when the compare signal is a first logic state the means for passing provides the primary voltage to the substrate of the integrated circuit to power the integrated circuit and when the compare signal is a second logic state the means for passing provides the secondary voltage to the substrate of the integrated circuit to power the integrated circuit.

15. The system of claim 14, wherein the means for bypassing the RC constant is a bypass element coupled to the voltage divider element and controlled by the compare signal.

16. The system of claim 14, wherein the means for passing comprises:

a first pass element controlled by the compare signal generated by the comparison element and coupled to the primary voltage; and a second pass element controlled by the compare signal and coupled to the second voltage signal, wherein the output node of the system is formed by the first pass element coupled to the second pass element.

17. A method for switching between power sources of the integrated circuit, the method comprising the steps of:

comparing a first voltage signal derived from a primary voltage provided by to the integrated circuit by a primary power source to a second voltage signal equal to a secondary voltage provided by a secondary power source and generating a compare signal;

dividing the primary voltage to derive the first voltage signal by a voltage divider element, having a RC constant, that is coupled to the primary power source and controlled by the compare signal;

powering up the primary power source; and bypassing the RC constant of the voltage divider element and immediately pulling the first voltage signal to the primary voltage when the first voltage signal becomes greater than the second voltage signal.

18. The method of claim 17, further comprising the step of:

passing the primary voltage or the secondary voltage to an output node of the system that is coupled to the substrate of the integrated circuit to power the integrated circuit, wherein when the compare signal is a first logic state passing the primary voltage to the substrate of the integrated circuit to power the integrated circuit and when the compare signal is a second logic state passing the secondary voltage to the substrate of the integrated circuit to power the integrated circuit.

19. The method of claim 17, wherein bypassing the RC constant and immediately pulling the first voltage signal to the primary voltage is accomplished by a bypass element coupled to the voltage divider element and controlled by the compare signal.

* * * * *